United States Patent [19]

Lim et al.

[11] Patent Number: 5,780,334
[45] Date of Patent: Jul. 14, 1998

[54] METHOD OF FABRICATING CAPACITOR OF SEMICONDUCTOR MEMORY DEVICE

[75] Inventors: Jun-Hee Lim; Mun-Mo Jeong, both of Seoul, Rep. of Korea

[73] Assignee: LG Semicon Co., Ltd., Chungcheongbuk-do, Rep. of Korea

[21] Appl. No.: 730,705

[22] Filed: Oct. 11, 1996

[30] Foreign Application Priority Data

Oct. 13, 1995 [KR] Rep. of Korea ............... 1995 35293

[51] Int. Cl.⁶ ........................................... H01L 21/8292
[52] U.S. Cl. .............................. 438/239; 438/253
[58] Field of Search ............................ 437/47, 48, 50, 437/52, 60, 919; 438/239, 253, 396, 210, 329

[56] References Cited

U.S. PATENT DOCUMENTS

| | | | |
|---|---|---|---|
| 5,372,962 | 12/1994 | Hirota et al. | 437/47 |
| 5,468,671 | 11/1995 | Ryou | 437/52 |
| 5,501,998 | 3/1996 | Chen | 437/52 |
| 5,595,929 | 1/1997 | Tseng | 437/52 |

*Primary Examiner*—John Niebling
*Assistant Examiner*—Joni Y. Chang
*Attorney, Agent, or Firm*—Morgan, Lewis & Bockius LLP

[57] ABSTRACT

A method of fabricating a capacitor of a semiconductor memory device includes the steps of: forming an interlevel insulating layer on a semiconductor substrate on which the capacitor will be formed, selectively etching a portion of the interlevel insulating layer placed on a capacitor forming portion to form a capacitor node hole, and forming a first temporary layer on the interlevel insulating layer, including a portion of the interlevel insulating layer in which the capacitor node hole is formed; forming a contact hole beneath the capacitor node hole in a capacitor contact portion; forming a conductive layer on the first temporary layer to bury the contact hole and the capacitor node hole, and then forming a second temporary layer on the conductive layer; etching back the second temporary layer through anisotropic etching process to expose the conductive layer, and to simultaneously form a temporary pillar layer inside the capacitor node hole, the temporary pillar layer being substantially surrounded by the conductive layer; removing a portion of the conductive layer placed on a portion other than the capacitor forming portion, to form a first capacitor electrode and to expose at least a portion of the first temporary layer; and removing remaining portions of the first and second temporary layers to expose an upper portion of the first capacitor electrode, forming a dielectric layer on a surface of the first capacitor electrode, and forming a second capacitor electrode on a surface of the dielectric layer.

17 Claims, 4 Drawing Sheets

METHOD OF FABRICATING CAPACITOR OF SEMICONDUCTOR MEMORY DEVICE

BACKGROUND OF THE INVENTION

1. Field of the Invention

The present invention relates to a method of fabricating a capacitor of a semiconductor memory device and, more particularly, to a method of fabricating a capacitor of a semiconductor memory device which method simplifies the fabrication process of a stack-type capacitor and increases its capacitance, and reduces the height difference between a memory cell and its peripherical circuit regions.

2. Discussion of the Related Art

As the capacitance of a semiconductor memory device is increased, the capacitor area per unit cell is decreased, which in turn reduces the capacitance. For the purpose of solving this problem, a three-dimensional structured capacitor, for example, a stack-type or fin-type capacitor, has been proposed. The stack-type capacitor is fabricated in a manner such that a first capacitor electrode or storage electrode is formed on a semiconductor substrate on which a word line and bit line are formed, a dielectric layer is formed thereon, and then a second electrode or plate electrode is formed on the dielectric layer.

However, in the aforementioned conventional method, the capacitor is formed in a threedimensional structure, thereby producing a height difference between a memory cell and periphery circuit regions of the semiconductor memory device before the process for forming a metal line of the memory device. This makes the metal line forming process difficult. To overcome this problem, a planarization must be carried out after the capacitor is formed, and an under layer of the metal line is planarized before photolithography for defining the metal line.

FIGS. 1A to 1D are cross-sectional views showing a conventional method for fabricating a capacitor of a semiconductor memory device. This method will now be explained.

As shown in FIG. 1A, an isolation region, word line 11, source/drain regions, and bit line 12 are formed on a semiconductor substrate 10, and an interlevel insulating layer 13 is formed on the overall surface of substrate 10. A nitride layer 14 is formed on interlevel insulating layer 13, and patterned to define a capacitor contact portion (region A). Then, interlevel insulating layer 13 is etched using nitride layer 14 as a mask, to form a contact hole.

As shown in FIG. 1B, an insulating sidewall 15 is formed on both sidewalls of the contact hole, and a polysilicon layer 16 is formed on nitride layer 14 to bury the contact hole. An oxide layer is formed on polysilicon layer 16, and patterned to form a pillar oxide layer 17. Here, insulating sidewall 15 formed on both sidewalls of the contact hole is formed for the purpose of improving the insulation characteristic between a capacitor electrode and bit line, or between the capacitor and word line. Then, as shown in FIG. 1C, a conductive sidewall 18 is formed on both sidewalls of pillar oxide layer 17, and an exposed portion of polysilicon layer 16 is removed.

As shown in FIG. 1D, pillar oxide layer 14 is removed through wet etching to form a first capacitor electrode 19 formed from polysilicon layer 16 and conductive sidewall 18. Thereafter, a dielectric layer 20 is formed on the surface of first capacitor electrode 19, and then a second capacitor electrode 21 is formed on the surface of dielectric layer 20.

In the aforementioned conventional method for fabricating a capacitor, a metal line is formed which connects elements of the memory cell region to elements of the peripherical circuit region, after the formation of the capacitor of the semiconductor memory device. This increases a height difference between the cell region in which the capacitor is formed and the periphery region and makes the fabrication process of the metal line difficult. Accordingly, an additional process for forming a planarizing layer must be carried out for the purpose of reducing the height difference.

SUMMARY OF THE INVENTION

Accordingly, the present invention is directed to a method of fabricating a capacitor of a semiconductor device which substantially obviates one or more of the problems due to limitations and disadvantages of the related art.

An object of the present invention is to provide an improved method for fabricating a capacitor of a semiconductor memory device which method simplifies the fabrication process of a capacitor and increases its capacitance, and reduces a height difference between a memory cell and its peripherical circuit regions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To accomplish these and other advantages, the method of fabricating a capacitor of a semiconductor memory device includes the steps of: forming an interlevel insulating layer on a semiconductor substrate on which the capacitor will be formed, selectively etching a portion of the interlevel insulating layer on a capacitor forming portion to form a capacitor node hole, and forming a first temporary layer on the interlevel insulating layer, including a portion of the interlevel insulating layer in which the capacitor node hole is formed; forming a contact hole beneath the capacitor node hole in a capacitor contact portion; forming a conductive layer on the first temporary layer to bury the contact hole and the capacitor node hole, and then forming a second temporary layer on the conductive layer; etching back the second temporary layer through anisotropic etching process to expose the conductive layer, and to simultaneously form a temporary pillar layer inside the capacitor node hole, the temporary pillar layer being substantially surrounded by the conductive layer; removing a portion of the conductive layer placed on a portion other than the capacitor forming portion, to form a first capacitor electrode and to expose at least a portion of the first temporary layer; and removing remaining portions of the first and second temporary layers to expose an upper portion of the first capacitor electrode, forming a dielectric layer on a surface of the first capacitor electrode, and forming a second capacitor electrode on a surface of the dielectric layer.

It is preferable that the contact hole in which the first capacitor electrode will be connected is formed in such a manner that a sidewall spacer is formed on the sidewalls of the capacitor node hole on which the first temporary layer is formed, and the bottom of the capacitor node hole between the sidewall spacers is etched using the sidewall spacer, thereby forming the contact hole. The first and second temporary layers are preferably formed of an identical material. In this case, the first and second temporary layers preferably have an etch selectivity to the interlevel insulating layer and conductive layer. It is preferable that the interlevel insulating layer is formed from a silicon oxide layer, and the first temporary layer is formed from a silicon nitride layer. The conductive layer is preferably formed of polysilicon, and the second temporary layer is preferably formed with a silicon oxide layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate a particular embodiment of the invention and, together with the description, serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
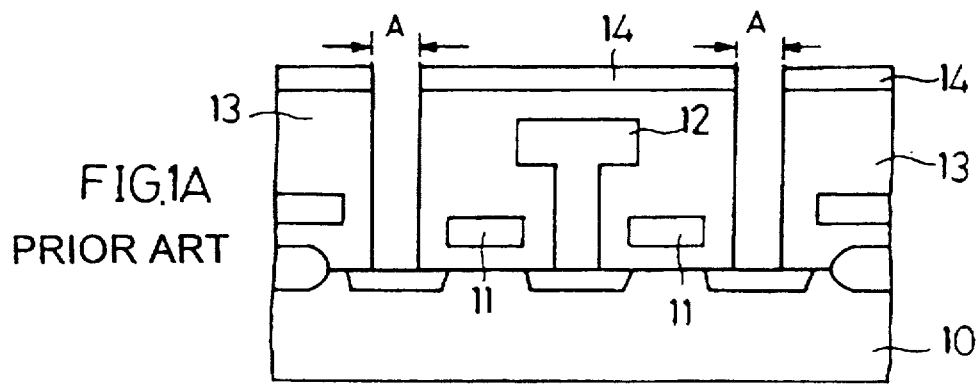
FIGS. 1A to 1D are cross-sectional views showing a conventional method for fabricating a capacitor of a semiconductor memory device.
Figure 1B:
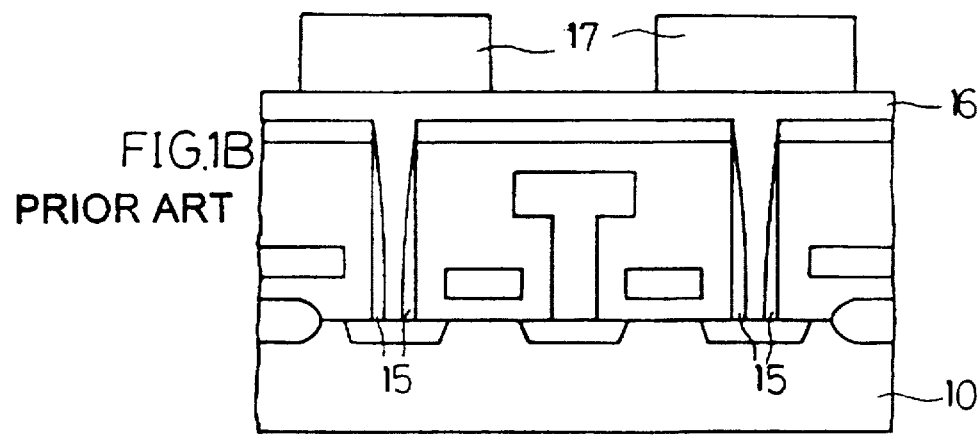
Figure 1C:
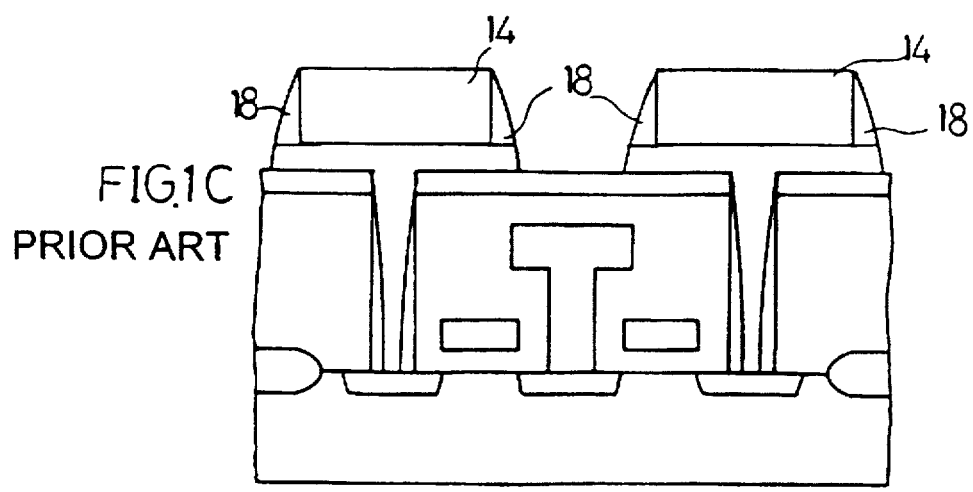
Figure 1D:
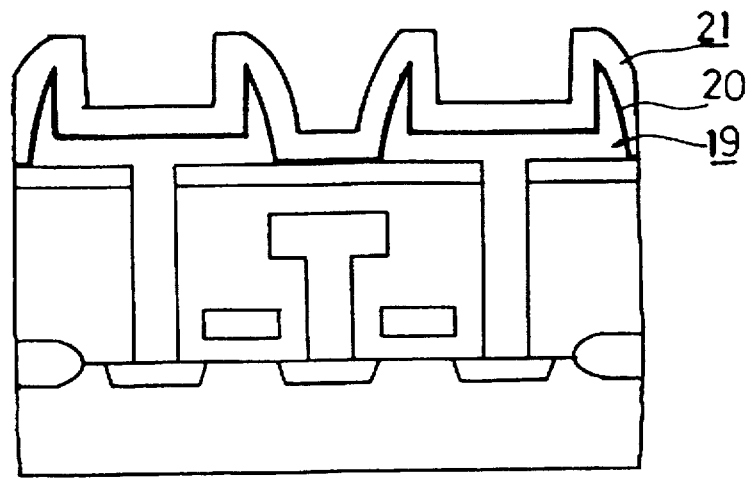
Figure 2A:
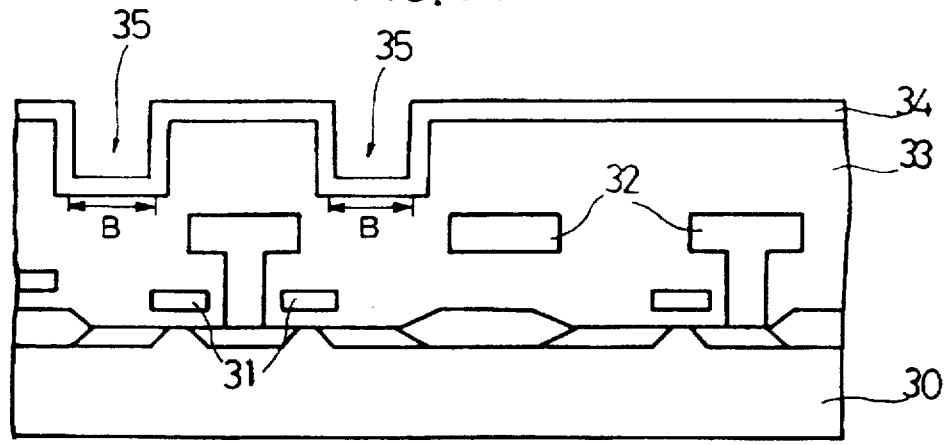
FIGS. 2A to 2G are cross-sectional views showing a method for fabricating a capacitor of a semiconductor memory device according to the present invention.

FIGS. 2A to 2G are cross-sectional views showing a method of fabricating a capacitor of a semiconductor memory device according to one embodiment of the present invention. As shown in FIG. 2A, an interlevel insulating layer 33 is formed on a semiconductor substrate 30 on which a word line 31, source/drain regions, and bit line 32 are formed. A portion of interlevel insulating layer 33 placed at a portion (region B) where a capacitor will be formed is selectively etched to a predetermined depth in order to form a capacitor node hole 35. Then, a first temporary layer, for example, nitride layer 34, is formed on interlevel insulating layer 33 including capacitor node hole 35.

Figure 2B:
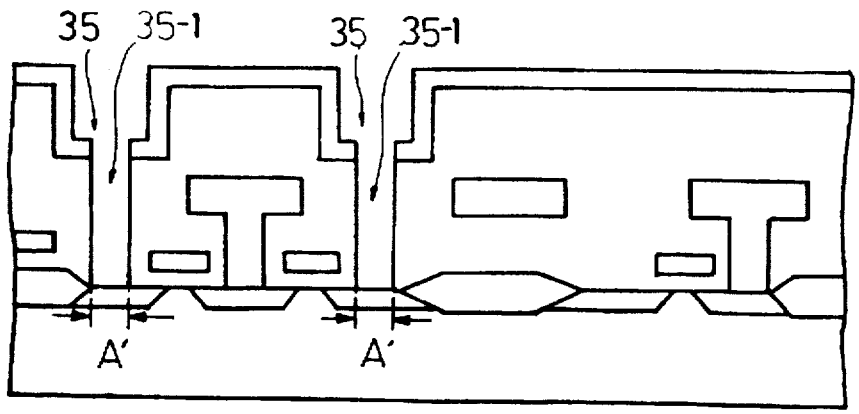

As shown in FIG. 2B, a contact hole 35-1 is formed under the bottom of capacitor node hole 35, that is, at a capacitor contact portion (region A'). Here, contact hole 35-1 is formed in a manner, such that a sidewall spacer (not shown) is formed on the sidewalls of capacitor node hole 35 on which the nitride layer is formed, a portion of the nitride layer and interlevel insulating layer placed under the bottom of the capacitor node hole between the sidewall spacers is selectively etched to form the contact hole, and then the sidewall spacers are removed. It is also possible that the contact hole may be formed through a photolithography process using a photoresist.

Figure 2C:
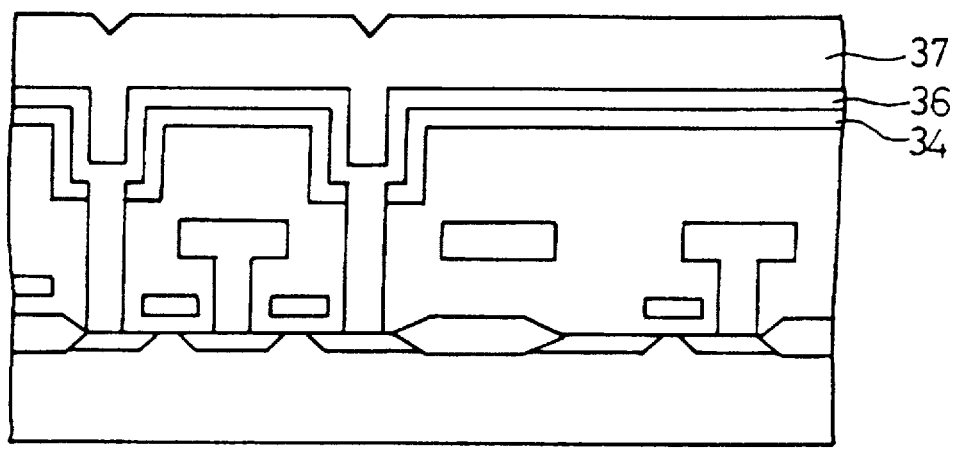
Figure 2D:
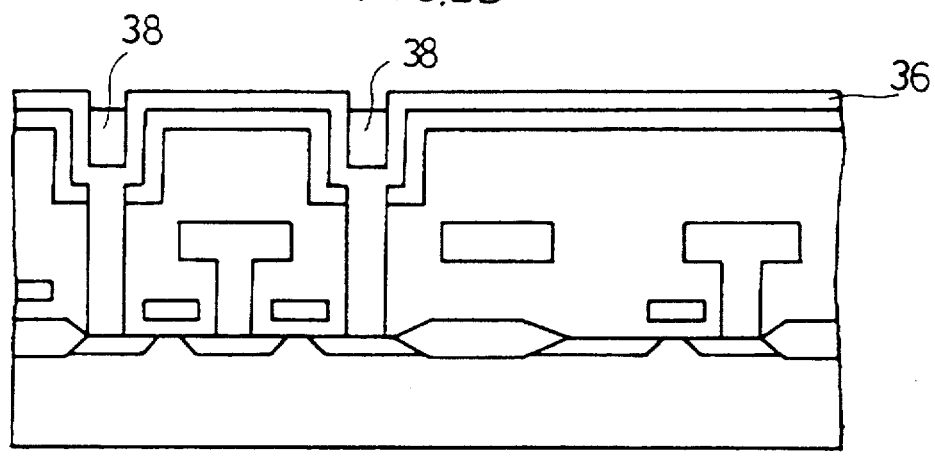

Then, as shown in FIG. 2C, polysilicon is deposited on the overall surface of the substrate to bury capacitor node hole 35 and contact hole 35-1, and simultaneously to form a polysilicon layer 36 on nitride layer 34. A second temporary layer such as oxide layer 37 is formed on polysilicon layer 36. Thereafter, as shown in FIG. 2D, second temporary layer 37 is etched back through anisotropic etching to be left only inside capacitor node hole 35, and simultaneously to expose the surface of polysilicon layer 36, thereby forming a pillar oxide layer 38 surrounded by polysilicon layer 36.

Figure 2E:
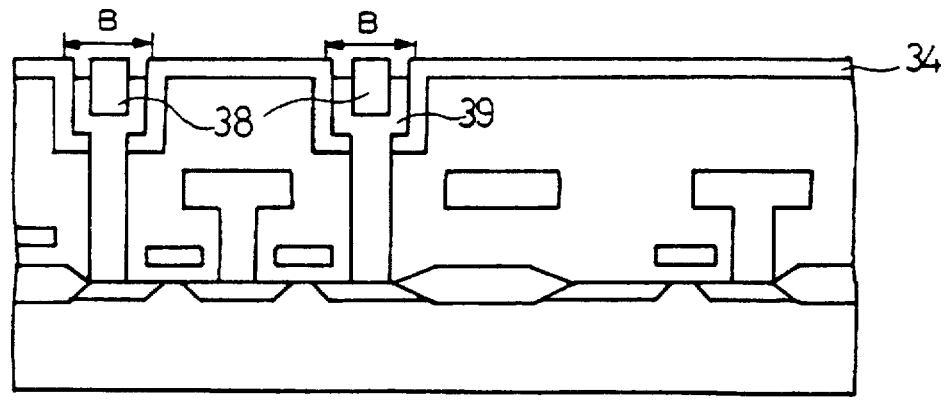
Figure 2F:
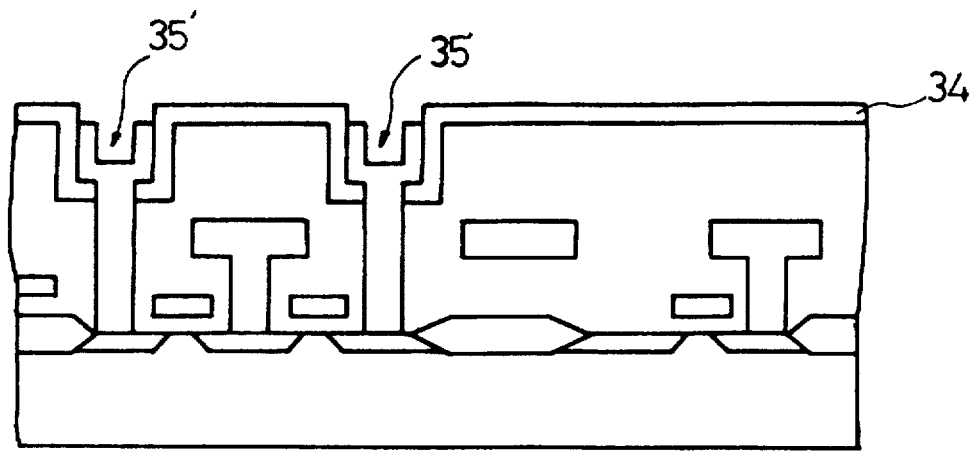
Figure 2G:
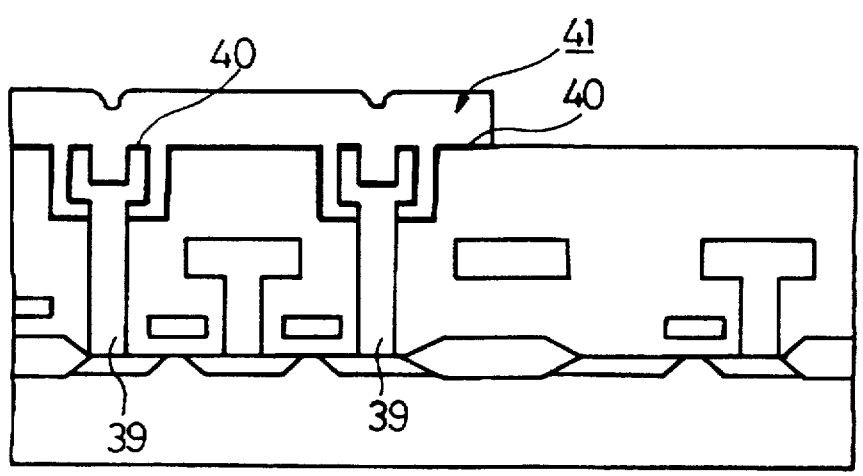

As shown in FIG. 2E, a portion of polysilicon layer 36 placed on a region excluding the capacitor portion (region B) is selectively removed, to form a first capacitor electrode 39 formed from the polysilicon layer, that is, to form a storage electrode and to expose nitride layer 34. Then, as shown in FIG. 2F, pillar oxide layer 38 is removed through a wet etch process to expose capacitor node hole 35'. As shown in FIG. 2G, nitride layer 34 is removed through a wet etch process to expose the top of first capacitor electrode 39, and then a dielectric layer 40 is formed on the surface of first capacitor electrode 39. Finally, a second capacitor electrode 41 is formed on the surface of dielectric layer 40. It is desirable that first and second temporary layers 34 and 38 are formed of an identical material. This is because it is possible for first and second temporary layers to be simultaneously removed in the process of FIGS. 2F and 2G. In this case, the first and second temporary layers preferably have an etch selectivity to interlevel insulating layer 33 and capacitor electrode 39.

In contrast to the conventional method in which the first capacitor electrode is formed on the interlevel insulating layer, in the method for fabricating a capacitor of a semiconductor device according to the present invention, the first capacitor electrode is formed so that it does not protrude above the surface of the interlevel insulating layer. This reduces the height of the memory cell region, facilitating the metal line formation process. Also, the first capacitor electrode is formed through a one-time deposition process of polysilicon, simplifying the capacitor fabricating process. Moreover, during the wet etch of the nitride layer, the bottom of the first capacitor electrode is exposed, and the first capacitor electrode formed of polysilicon is configured to be porous due to an etch solution for wet-etching the nitride layer. This increases the surface area of the first capacitor electrode which comes into contact with the dielectric layer, resulting in an increase of the capacitance.

It will be apparent to those skilled in the art that various modifications and variations can be made in the method of fabricating a capacitor of a semiconductor memory device of the present invention without departing from the spirit or scope of the invention. Thus, it is intended that the present invention cover modifications and variations of this invention provided they come within the scope of the appended claims and their equivalents.

what is claimed is:

1. A method of fabricating a capacitor of a semiconductor memory device, the method comprising the steps of:

(a) forming an interlevel insulating layer on a semiconductor substrate on which the capacitor will be formed, selectively etching a portion of the interlevel insulating layer placed on a capacitor forming portion to form a capacitor node hole, and forming a first temporary layer on the interlevel insulating layer, including a portion of the interlevel insulating layer in which the capacitor node hole is formed;

(b) forming a contact hole beneath the capacitor node hole in a capacitor contact portion;

(c) forming a conductive layer on the first temporary layer to bury the contact hole and the capacitor node hole, and then forming a second temporary layer on the conductive layer;

(d) etching back the second temporary layer through anisotropic etching process to expose the conductive layer, and to simultaneously form a temporary pillar layer inside the capacitor node hole, both sides of the temporary pillar layer being [substantially] surrounded by the conductive layer;

(e) removing a portion of the conductive layer placed on a portion other than the capacitor forming portion, to form a first capacitor electrode and to expose at least a portion of the first temporary layer; and (f) removing remaining portions of the first and second temporary layers to expose an upper portion of the first capacitor electrode, forming a dielectric layer on a surface of the first capacitor electrode, and forming a second capacitor electrode on a surface of the dielectric layer.

2. The method of fabricating a capacitor of a semiconductor memory device as claimed in claim 1, wherein step (b) comprises the substeps of:

forming sidewall spacers on side walls of the capacitor node hole on which the first temporary layer is formed; and selectively etching a bottom portion of the capacitor node hole and a portion of the interlevel insulating layer located between the sidewall spacers using the sidewall spacers as a mask.

3. The method of fabricating a capacitor of a semiconductor memory device as claimed in claim 1, wherein the contact hole is formed such that a bottom portion of the capacitor node hole and a portion of the interlevel insulating layer beneath the capacitor node hole are selectively etched through a photolithography process using a photoresist.

4. The method of fabricating a capacitor of a semiconductor memory device as claimed in claim 1, wherein the first and second temporary layers are formed of an identical material.

5. The method of fabricating a capacitor of a semiconductor memory device as claimed in claim 1, wherein the first and second temporary layers have an etch selectivity with respect to the interlevel insulating layer and the conductive layer.

6. The method of fabricating a capacitor of a semiconductor memory device as claimed in claim 1, wherein the conductive layer is formed of polysilicon.

7. The method of fabricating a capacitor of a semiconductor memory device as claimed in claim 1, wherein the interlevel insulating layer is formed from a silicon oxide layer, the first temporary layer is formed from a silicon nitride layer, the conductive layer is formed from polysilicon, and the second temporary layer is formed from a silicon oxide layer.

8. The method of fabricating a capacitor of a semiconductor memory device as claimed in claim 7, wherein, during step (f), the first and second temporary layers are removed in a manner such that the second temporary layer is first removed, and then the first temporary layer is removed.

9. The method of fabricating a capacitor of a semiconductor memory device as claimed in claim 5, wherein the first and second temporary layers are removed through a wet etch process.

10. A method of fabricating a capacitor of a semiconductor memory device, the method comprising the steps of:

forming a first insulating layer on a semiconductor substrate;

forming a capacitor node hole in the insulating layer;

forming a second insulating layer on the first insulating layer including the capacitor node hole;

forming a contact hole in the first insulating layer and the second insulating layer, the capacitor node hole and the contact hole being formed such that the contact hole is located beneath the capacitor node hole;

forming a first capacitor electrode having at least a portion within the contact hole and at least a portion formed over a bottom surface of the capacitor node hole;

forming a dielectric layer on a surface of the first capacitor electrode; and forming a second capacitor electrode on a surface of the dielectric layer.

11. (Amended) The method of claim 10, wherein the first capacitor electrode is formed such that a portion of the first capacitor electrode over the bottom surface of the capacitor node hole is wider than the portion of the first capacitor electrode within the contact hole.

12. The method of claim 10, wherein the capacitor node hole is formed before the contact hole.

13. The method of claim 10, wherein the contact hole is formed by forming sidewall spacers on sidewalls of the capacitor node hole and then etching a bottom portion of the capacitor node hole and a portion of the insulating layer located between the sidewall spacers using the sidewall spacers as a mask.

14. The method of claim 10, wherein the first capacitor electrode is formed such that the first capacitor electrode does not protrude above the first insulating layer.

15. The method of claim 10, wherein the first capacitor electrode is formed through a one-time polysilicon deposition process.

16. The method of claim 10, wherein the first capacitor electrode is formed to be porous through use of an etch solution during a wet-etch process.

17. The method of claim 10, further comprising the step of removing the second insulating layer prior to the step of forming the dielectric layer.

* * * * *